United States Patent
Krapohl

(10) Patent No.: US 9,116,184 B2
(45) Date of Patent: Aug. 25, 2015

(54) SYSTEM AND METHOD FOR VERIFYING THE OPERATING FREQUENCY OF DIGITAL CONTROL CIRCUITRY

(71) Applicant: COVIDIEN LP, Mansfield, MA (US)

(72) Inventor: James E. Krapohl, Broomfield, CO (US)

(73) Assignee: Covidien LP, Mansfield, MA (US)

( * ) Notice: Subject to any disclaimer, the term of this patent is extended or adjusted under 35 U.S.C. 154(b) by 25 days.

(21) Appl. No.: 14/183,196

(22) Filed: Feb. 18, 2014

(65) Prior Publication Data

US 2014/0159703 A1    Jun. 12, 2014

Related U.S. Application Data

(63) Continuation of application No. 13/360,140, filed on Jan. 27, 2012, now Pat. No. 8,664,934.

(51) Int. Cl.
   *G01R 13/34*    (2006.01)
   *G01R 23/02*    (2006.01)
   *G01R 31/317*   (2006.01)

(52) U.S. Cl.
   CPC .......... *G01R 23/02* (2013.01); *G01R 31/31726* (2013.01)

(58) Field of Classification Search
   CPC ............. G01R 31/275; G01R 31/2884; G01R 31/31716; G01R 31/31725; G01R 23/02; G01R 31/31726
   See application file for complete search history.

(56) References Cited

U.S. PATENT DOCUMENTS

| | | | |
|---|---|---|---|
| 3,319,179 A | | 5/1967 | Hepner |
| 3,614,619 A | | 10/1971 | Huntsinger et al. |
| 3,824,406 A | | 7/1974 | Ellis |
| 3,935,538 A | | 1/1976 | Kizler et al. |
| 4,739,759 A | | 4/1988 | Rexroth et al. |
| 5,719,521 A | | 2/1998 | Wong |
| 5,772,659 A | | 6/1998 | Becker et al. |
| 5,982,824 A | | 11/1999 | Ann |
| 6,166,606 A | * | 12/2000 | Tsyrganovich ............. 331/25 |
| 6,175,280 B1 | | 1/2001 | Lloyd et al. |
| 6,210,403 B1 | | 4/2001 | Klicek |
| 6,747,519 B2 | * | 6/2004 | Jaehne et al. ............. 331/16 |
| 7,300,435 B2 | | 11/2007 | Wham et al. |
| D574,323 S | | 8/2008 | Waaler |
| 7,755,341 B2 | | 7/2010 | Philbrick |
| 7,846,156 B2 | | 12/2010 | Malis et al. |

(Continued)

FOREIGN PATENT DOCUMENTS

| DE | 179607 C | 3/1905 |
|---|---|---|
| DE | 390937 C | 3/1924 |

(Continued)

OTHER PUBLICATIONS

Cosman et al., "Theoretical Aspects of Radiofrequency Lesions in the Dorsal Root Entry Zone" Neurosurgery 15: (1984) pp. 945-950.

(Continued)

*Primary Examiner* — Tung X Nguyen

(57) ABSTRACT

A system and method are presented for verifying the operating frequency of digital control circuitry. The system and method according to the present disclosure provide for a digitally controlled system, such as an electrosurgical system, to confirm or verify its operating frequency using a single external device, and software and/or firmware.

20 Claims, 3 Drawing Sheets

(56) References Cited

U.S. PATENT DOCUMENTS

| | | |
|---|---|---|
| 2005/0286670 A1 | 12/2005 | Jungerman |
| 2007/0188246 A1 | 8/2007 | Lee et al. |
| 2011/0068828 A1 | 3/2011 | Anderson et al. |
| 2011/0071521 A1 | 3/2011 | Gilbert |

FOREIGN PATENT DOCUMENTS

| | | |
|---|---|---|
| DE | 1099658 B | 2/1961 |
| DE | 1139927 B | 11/1962 |
| DE | 1149832 B | 6/1963 |
| DE | 1439302 A1 | 1/1969 |
| DE | 2439587 A1 | 2/1975 |
| DE | 2455174 A1 | 5/1975 |
| DE | 2407559 A1 | 8/1975 |
| DE | 2602517 A1 | 7/1976 |
| DE | 2504280 A1 | 8/1976 |
| DE | 2540968 A1 | 3/1977 |
| DE | 2820908 A1 | 11/1978 |
| DE | 2803275 A1 | 8/1979 |
| DE | 2823291 A1 | 11/1979 |
| DE | 2946728 A1 | 5/1981 |
| DE | 3143421 A1 | 5/1982 |
| DE | 3045996 A1 | 7/1982 |
| DE | 3120102 A1 | 12/1982 |
| DE | 3510586 A1 | 10/1986 |
| DE | 3604823 A1 | 8/1987 |
| DE | 3904558 A1 | 8/1990 |
| DE | 3942998 A1 | 7/1991 |
| DE | 4206433 A1 | 9/1993 |
| DE | 4339049 A1 | 5/1995 |
| DE | 19506363 A1 | 8/1996 |
| DE | 19717411 A1 | 11/1998 |
| DE | 19848540 A1 | 5/2000 |
| EP | 0 246 350 A1 | 11/1987 |
| EP | 267403 A2 | 5/1988 |
| EP | 296777 A2 | 12/1988 |
| EP | 310431 A2 | 4/1989 |
| EP | 325456 A2 | 7/1989 |
| EP | 336742 A2 | 10/1989 |
| EP | 390937 A1 | 10/1990 |
| EP | 0 566 705 A1 | 8/1993 |
| EP | 608609 A2 | 8/1994 |
| EP | 0 836 868 A2 | 4/1998 |
| EP | 880220 A2 | 11/1998 |
| EP | 0 882 955 A1 | 12/1998 |
| EP | 1051948 A2 | 11/2000 |
| EP | 1366724 A1 | 12/2003 |
| EP | 1766929 A1 | 4/2007 |
| FR | 1 275 415 A | 11/1961 |
| FR | 1 347 865 A | 1/1964 |
| FR | 2 313 708 A1 | 12/1976 |
| FR | 2364461 A1 | 4/1978 |
| FR | 2 502 935 A1 | 10/1982 |
| FR | 2 517 953 A1 | 6/1983 |
| FR | 2 573 301 A1 | 5/1986 |
| SU | 166452 | 11/1964 |
| SU | 727201 A2 | 4/1980 |
| WO | 02/11634 A1 | 2/2002 |
| WO | 02/45589 A2 | 6/2002 |
| WO | 03/090635 A1 | 11/2003 |
| WO | 2006/050888 A1 | 5/2006 |
| WO | 2008053532 A1 | 5/2008 |

OTHER PUBLICATIONS

Goldberg et al., "Tissue Ablation with Radiofrequency: Effect of Probe Size, Gauge, Duration, and Temperature on Lesion Volume" Acad Radio (1995) vol. 2, No. 5, pp. 399-404.
Medtrex Brochure—Total Control at Full Speed, "The O.R. Pro 300" 1 p. Sep. 1998.
Valleylab Brochure "Valleylab Electroshield Monitoring System" 2 pp. Nov. 1995.
International Search Report EP 98300964.8 dated Dec. 4, 2000.
International Search Report EP 04009964 dated Jul. 13, 2004.
International Search Report EP 04011375 dated Sep. 10, 2004.
International Search Report EP 04015981.6 dated Sep. 29, 2004.
International Search Report EP04707738 dated Jul. 4, 2007.
International Search Report EP 05002769.7 dated Jun. 9, 2006.
International Search Report EP 05014156.3 dated Dec. 28, 2005.
International Search Report EP 05021944.3 dated Jan. 18, 2006.
International Search Report EP 05022350.2 dated Jan. 18, 2006.
International Search Report EP 06000708.5 dated Apr. 21, 2006.
International Search Report—extended EP 06000708.5 dated Aug. 22, 2006.
International Search Report EP 06006717.0 dated Aug. 7, 2006.
International Search Report EP 06010499.9 dated Jan. 29, 2008.
International Search Report EP 06022028.2 dated Feb. 5, 2007.
International Search Report EP 06025700.3 dated Apr. 12, 2007.
International Search Report EP 07001481.6 dated Apr. 23, 2007.
International Search Report EP 07001484.0 dated Jun. 14, 2010.
International Search Report EP 07001485.7 dated May 15, 2007.
International Search Report EP 07001489.9 dated Dec. 20, 2007.
International Search Report EP 07001491 dated Jun. 6, 2007.
International Search Report EP 07001494.9 dated Aug. 25, 2010.
International Search Report EP 07001494.9 extended dated Mar. 7, 2011.
International Search Report EP 07001527.6 dated May 9, 2007.
International Search Report EP 07004355.9 dated May 21, 2007.
International Search Report EP 07008207.8 dated Sep. 13, 2007.
International Search Report EP 07009322.4 dated Jan. 14, 2008.
International Search Report EP 07010673.7 dated Sep. 24, 2007.
International Search Report EP 07015601.3 dated Jan. 4, 2008.
International Search Report EP 07015602.1 dated Dec. 20, 2007.
International Search Report EP 07019174.7 dated Jan. 29, 2008.
International Search Report EP08004667.5 dated Jun. 3, 2008.
International Search Report EP08006733.3 dated Jul. 28, 2008.
International Search Report EP08012503 dated Sep. 19, 2008.
International Search Report EP08013605 dated Feb. 25, 2009.
International Search Report EP08015601.1 dated Dec. 5, 2008.
International Search Report EP08155780 dated Jan. 19, 2009.
International Search Report EP08016540.0 dated Feb. 25, 2009.
International Search Report EP08166208.2 dated Dec. 1, 2008.
International Search Report EP09003678.1 dated Aug. 7, 2009.
International Search Report EP09004250.8 dated Aug. 2, 2010.
International Search Report EP09005160.8 dated Aug. 27, 2009.
International Search Report EP09009860 dated Dec. 8, 2009.
International Search Report EP09012386 dated Apr. 1, 2010.
International Search Report EP09012388.6 dated Apr. 13, 2010.
International Search Report EP09012389.4 dated Jul. 6, 2010.
International Search Report EP09012391.0 dated Apr. 19, 2010.
European Search Report dated Jul. 11, 2013 for European Patent Appln. No. EP 13 15 1440.
U.S. Appl. No. 10/406,690, filed Apr. 3, 2003, Robert J. Behnke, II.
U.S. Appl. No. 10/573,713, filed Mar. 28, 2006, Robert H. Wham.
U.S. Appl. No. 10/761,524, filed Jan. 21, 2004, Robert Wham.
U.S. Appl. No. 11/242,458, filed Oct. 3, 2005, Daniel J. Becker.
U.S. Appl. No. 12/793,136, filed Jun. 3, 2010, Gary M. Couture.
U.S. Appl. No. 12/823,703, filed Jun. 25, 2010, Mark A. Johnston.
U.S. Appl. No. 12/826,879, filed Jun. 30, 2010, Christopher A. Deborski.
U.S. Appl. No. 12/834,364, filed Jul. 12, 2010, David S. Keppel.
U.S. Appl. No. 12/845,203, filed Jul. 28, 2010, Gary M. Couture.
U.S. Appl. No. 12/985,063, filed Jan. 5, 2011, Robert J. Behnke, II.
U.S. Appl. No. 13/034,822, filed Feb. 25, 2011, Mark A. Johnston.
U.S. Appl. No. 13/048,639, filed Mar. 15, 2011, James S. Cunningham.
U.S. Appl. No. 13/049,459, filed Mar. 16, 2011, James H. Orszulak.
U.S. Appl. No. 13/050,770, filed Mar. 17, 2011, Robert B. Smith.
U.S. Appl. No. 13/085,258, filed Apr. 12, 2011, Ronald J. Podhajsky.
U.S. Appl. No. 13/085,278, filed Apr. 12, 2011, James A. Gilbert.
U.S. Appl. No. 13/118,973, filed May 31, 2011, James H. Orszulak.
U.S. Appl. No. 13/186,107, filed Jul. 19, 2011, George J. Collins.
U.S. Appl. No. 13/186,121, filed Jul. 19, 2011, George J. Collins.
U.S. Appl. No. 13/195,607, filed Aug. 1, 2011, James H. Orszulak.
U.S. Appl. No. 13/221,424, filed Aug. 30, 2011, James E. Krapohl.
U.S. Appl. No. 13/227,704, filed Sep. 8, 2011, Thomas Plaven.
U.S. Appl. No. 13/228,996, filed Sep. 9, 2011, Robert B. Smith.

(56) References Cited

OTHER PUBLICATIONS

U.S. Appl. No. 13/236,997, filed Sep. 20, 2011, Robert J. Behnke, II.
U.S. Appl. No. 13/237,068, filed Sep. 20, 2011, Robert J. Behnke, II.
U.S. Appl. No. 13/237,187, filed Sep. 20, 2011, Robert J. Behnke, II.
U.S. Appl. No. 13/237,342, filed Sep. 20, 2011, Robert J. Behnke, II.
U.S. Appl. No. 13/237,488, filed Sep. 20, 2011, Robert J. Behnke, II.
U.S. Appl. No. 13/246,035, filed Sep. 27, 2011, Darren Odom.
U.S. Appl. No. 13/247,043, filed Sep. 28, 2011, Donald W. Heckel.
Wald et al., "Accidental Burns", JAMA, Aug. 16, 1971, vol. 217, No. 7, pp. 916-921.
Vallfors et al., "Automatically Controlled Bipolar Electrosoagulation—'COA-COMP'" Neurosurgical Review 7:2-3 (1984) pp. 187-190.
Sugita et al., "Bipolar Coagulator with Automatic Thermocontrol" J. Neurosurg., vol. 41, Dec. 1944, pp. 777-779.
Prutchi et al. "Design and Development of Medical Electronic Instrumentation", John Wiley & Sons, Inc. 2005.
Muller et al. "Extended Left Hemicolectomy Using the LigaSure Vessel Sealing System" Innovations That Work; Company Newsletter; Sep. 1999.
Ogden Goertzel Alternative to the Fourier Transform: Jun. 1993 pp. 485-487 Electronics World; Reed Business Publishing, Sutton, Surrey, BG vol. 99, No. 9. 1687.
Hadley I C D et al., "Inexpensive Digital Thermometer for Measurements on Semiconductors" International Journal of Electronics; Taylor and Francis. Ltd.; London, GB; vol. 70, No. 6 Jun. 1, 1991; pp. 1155-1162.
Burdette et al. "In Vivo Probe Measurement Technique for Determining Dielectric Properties at VHF Through Microwave Frequencies", IEEE Transactions on Microwave Theory and Techniques, vol. MTT-28, No. 4, Apr. 1980 pp. 414-427.
Richard Wolf Medical Instruments Corp. Brochure, "Kleppinger Bipolar Forceps & Bipolar Generator" 3 pp. Jan. 1989.
Astrahan, "A Localized Current Field Hyperthermia System for Use with 192-Iridium Interstitial Implants" Medical Physics, 9 (3), May/Jun. 1982.
Alexander et al., "Magnetic Resonance Image-Directed Stereotactic Neurosurgery: Use of Image Fusion with Computerized Tomography to Enhance Spatial Accuracy" Journal Neurosurgery, 83; (1995) pp. 271-276.
Geddes et al., "The Measurement of Physiologic Events by Electrical Impedence" Am. J. MI, Jan. Mar. 1964, pp. 16-27.
Cosman et al., "Methods of Making Nervous System Lesions" in William RH, Rengachary SS (eds): Neurosurgery, New York: McGraw-Hill, vol. 111, (1984), pp. 2490-2499.
Anderson et al., "A Numerical Study of Rapid Heating for High Temperature Radio Frequency Hyperthermia" International Journal of Bio-Medical Computing, 35 (1994) pp. 297-307.
Benaron et al., "Optical Time-Of-Flight and Absorbance Imaging of Biologic Media", Science, American Association for the Advancement of Science, Washington, DC, vol. 259, Mar. 5, 1993, pp. 1463-1466.
Cosman et al., "Radiofrequency Lesion Generation and Its Effect on Tissue Impedance" Applied Neurophysiology 51: (1988) pp. 230-242.
Ni W. et al. "A Signal Processing Method for the Coriolis Mass Flowmeter Based on a Normalized . . . " Journal of Applied Sciences-Yingyong Kexue Xuebao, Shangha CN, vol. 23 No. 2;(Mar. 2005); pp. 160-164 T.
Chicharo et al. "A Sliding Goertzel Algorith" Aug. 1996, pp. 283-297 Signal Processing, Elsevier Science Publishers B. V. Amsterdam, NL vol. 52 No. 3.
Bergdahl et al., "Studies on Coagulation and the Development of an Automatic Computerized Bipolar Coagulator" Journal of Neurosurgery 75:1, (Jul. 1991) pp. 148-151.
International Search Report EP09012392 dated Mar. 30, 2010.
International Search Report EP09012396 dated Apr. 7, 2010.
International Search Report EP09012400 dated Apr. 7, 2010.
International Search Report EP09156861.8 dated Jul. 14, 2009.
International Search Report EP09158915 dated Jul. 14, 2009.
International Search Report EP09164754.5 dated Aug. 21, 2009.
International Search Report EP09169377.0 dated Dec. 15, 2009.
International Search Report EP09169588.2 dated Mar. 2, 2010.
International Search Report EP09169589.0 dated Mar. 2, 2010.
International Search Report EP09172749.5 dated Dec. 4, 2009.
International Search Report EP10001808.4 dated Jun. 21, 2010.
International Search Report EP10150563.4 dated Jun. 10, 2010.
International Search Report EP10150564.2 dated Mar. 29, 2010.
International Search Report EP10150565.9 dated Mar. 12, 2010.
International Search Report EP10150566.7 dated Jun. 10, 2010.
International Search Report EP10150567.5 dated Jun. 10, 2010.
International Search Report EP10164740.2 dated Aug. 3, 2010.
International Search Report EP10171787.4 dated Nov. 18, 2010.
International Search Report EP10172636.2 dated Dec. 6, 2010.
International Search Report EP10174476.1 dated Nov. 12, 2010.
International Search Report EP10178287.8 dated Dec. 14, 2010.
International Search Report EP10179321.4 dated Mar. 18, 2011.
International Search Report EP10179353.7 dated Dec. 21, 2010.
International Search Report EP10179363.6 dated Jan. 12, 2011.
International Search Report EP10180004.3 dated Jan. 5, 2011.
International Search Report EP10180964.8 dated Dec. 22, 2010.
International Search Report EP10180965.5 dated Jan. 26, 2011.
International Search Report EP10181018.2 dated Jan. 26, 2011.
International Search Report EP10181060.4 dated Jan. 26, 2011.
International Search Report EP10182003.3 dated Dec. 28, 2010.
International Search Report EP10182005.8 dated Jan. 5, 2011.
International Search Report EP10188190.2 dated Nov. 22, 2010.
International Search Report EP10191319.2 dated Feb. 22, 2011.
International Search Report EP10195393.3 dated Apr. 11, 2011.
International Search Report EP11155959.7 dated Jun. 30, 2011.
International Search Report EP11155960.5 dated Jun. 10, 2011.
International Search Report PCT1US03133711 dated Jul. 16, 2004.
International Search Report PCT1US03133832 dated Jun. 17, 2004.
International Search Report PCT1US03137110 dated Jul. 25, 2005.
International Search Report PCT1US03137310 dated Aug. 13, 2004.
International Search Report PCT1US04102961 dated Aug. 2, 2005.
International Search Report PCT1US04113443 dated Dec. 10, 2004.
International Search Report PCT1US081052460 dated Apr. 24, 2008.
International Search Report PCT1US09146870 dated Jul. 21, 2009.

* cited by examiner

SYSTEM AND METHOD FOR VERIFYING THE OPERATING FREQUENCY OF DIGITAL CONTROL CIRCUITRY

CROSS-REFERENCE TO RELATED APPLICATIONS

This application is a continuation application of U.S. patent application Ser. No. 13/360,140, filed on Jan. 27, 2012 now U.S. Pat. No. 8,664,934, the entire contents of which are hereby incorporated herein by reference.

BACKGROUND

1. Technical Field

The present disclosure relates to digital control circuitry and, more particularly, to a system and method for verifying the operating frequency of digital control circuitry.

2. Discussion of Related Art

Many electrical systems, such as electrosurgical systems, employ digital control circuitry which drive time critical functions. The control circuitry could include, but is not limited to, microcontrollers, digital signal processors (DSPs) and field-programmable gate arrays (FPGAs). Typically, the digital control circuitry is clocked off of a single oscillator circuit. In the case of an oscillator circuit malfunction, the control circuitry may operate at an incorrect or undersirable frequency, which may be problematic. A few examples of systems which rely on accurate clock rate for effective operation include digital power supplies, RF inverters and ultrasonic inverters.

In the example of a digital power supply, the control circuitry provides PWM signals which are used to turn power mosfets on and off. Timing of these switching events is important. Not only could a shift in frequency result in loss of efficiency, but could also cause shoot-through or magnetic saturation, resulting in possible circuit failure.

Similar issues exist for inverter circuits, such as push-pull, full bridge or half bridge. Other concerns include clinical effectiveness and possible EMC violations if the output frequency drifts.

In a system that is space constrained, it would be desirable to have the ability for the control circuitry to confirm its own operating frequency, without complex external circuitry, prior to power output. In doing so, system confidence would be high prior to power generation and output knowing the output is within the system's operating frequency limits.

SUMMARY

The present disclosure relates to a system and method for verifying the operating or operational frequency of digital control circuitry. The system and method according to the present disclosure provide for a digitally controlled system, such as an electrosurgical system, to confirm or verify its operating frequency using a single external device, and software and/or firmware.

In embodiments described herein the term "clock rate" is defined as the fundamental rate in cycles per second at which a computer or digital control circuitry performs its most basic operations such as adding two numbers or transferring a value from one register to another.

In particular, a method for verifying an operational frequency in a digital control circuitry includes operating an oscillator at a predetermined frequency; inputting a first clock signal generated by the oscillator to the digital control circuitry via a first input; determining the number of transitions of the first clock signal at the first input; inputting a second clock signal to the digital control circuitry via a second input; initiating a timed sequence where the number of transitions at the first input are counted over a predetermined number of control clock cycles at the second input; and determining the operational frequency of the digital control circuitry using the predetermined number of clock cycles, the number of transitions of the first clock signal, and the predetermined frequency of the oscillator.

The step of determining the operational frequency includes determining the operational frequency by dividing the number of clock cycles by the number of transitions and then multiplying the result with the predetermined frequency of the oscillator. The oscillator is an external oscillator relative to the digital control circuitry. The second clock signal is generated by a control oscillator. The digital control circuitry includes devices selected from the group consisting of microcontrollers, digital signal processors (DSPs), and field-programmable gate arrays (FPGAs).

The method further includes selecting the predetermined frequency of the oscillator. The step of selecting the predetermined frequency of the oscillator includes taking into account criteria selected from the group consisting of a clock rate corresponding to a system controlled by the digital control circuitry, absolute tolerance of the frequency of the system being controlled, and a rate at which verification of the operational frequency needs to take place.

The system according to the present disclosure for verifying an operational frequency in a digital control circuitry includes a first oscillator operating at a predetermined frequency; and a second oscillator. A first clock signal generated by the first oscillator is received by the digital control circuitry via a first input. A second clock signal generated by the second oscillator is received by the digital control circuitry via a second input.

The system further includes means for initiating a timed sequence where a number of transitions at the first input are counted over a predetermined number of control clock cycles at the second input; and means for determining the operational frequency of the digital control circuitry using the predetermined number of clock cycles, the number of transitions of the first clock signal, and the predetermined frequency of the oscillator.

The means for determining the operational frequency includes means for determining the operational frequency by dividing the number of clock cycles by the number of transitions and then multiplying the result with the predetermined frequency of the oscillator. The first oscillator is an external oscillator relative to the digital control circuitry. The digital control circuitry includes devices selected from the group consisting of microcontrollers, digital signal processors (DSPs), and field-programmable gate arrays (FPGAs).

The system further includes means for selecting the predetermined frequency of the oscillator. The means for selecting the predetermined frequency of the oscillator includes taking into account criteria selected from the group consisting of a clock rate corresponding to a system controlled by the digital control circuitry, absolute tolerance of the frequency of the system being controlled, and a rate at which verification of the operational frequency needs to take place.

BRIEF DESCRIPTION OF THE DRAWINGS

Aspects and features of the presently-disclosed systems and methods will become apparent to those of ordinary skill in the art when descriptions thereof are read with reference to the accompanying drawings, of which.

DETAILED DESCRIPTION

Figure 1:
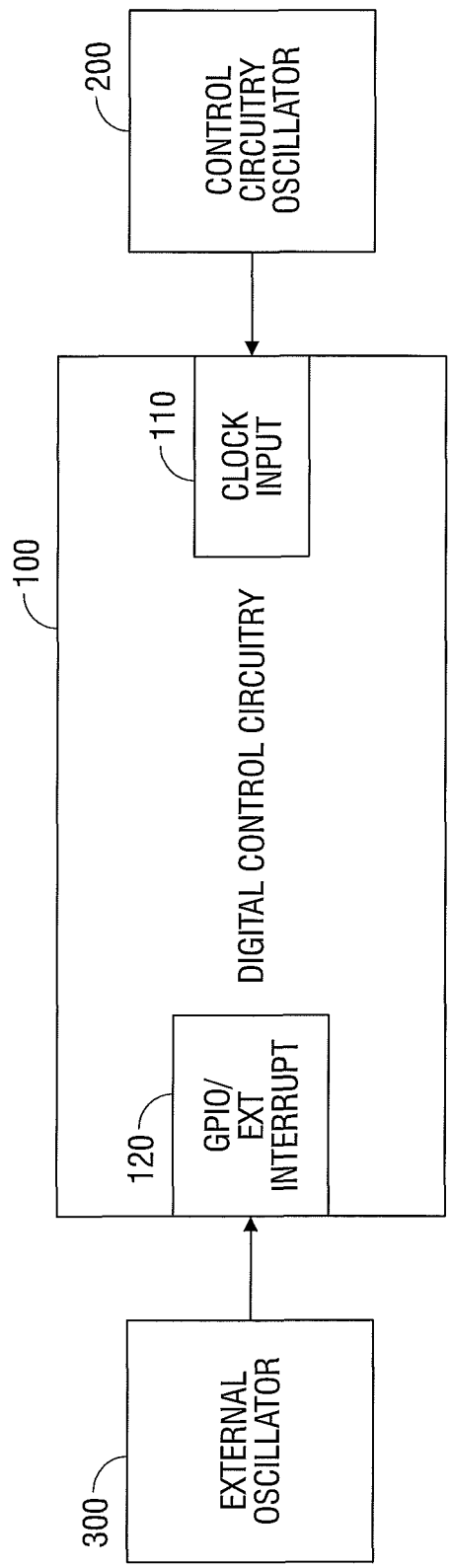
FIG. 1 is a block diagram of a system which allows digital control circuitry to confirm or verify its operating or operational frequency using an external device and software and/or firmware in accordance with an embodiment of the present disclosure.

Hereinafter, embodiments of the presently-disclosed system and method for verifying the operating frequency of digital control circuitry are described with reference to the accompanying drawings. Like reference numerals may refer to similar or identical elements throughout the description of the figures.

The present disclosure relates to a system and method for verifying the operating or operational frequency of digital control circuitry. The system and method according to the present disclosure provide for a digitally controlled system, such as an electrosurgical system, to confirm or verify the operating frequency of its digital control circuitry using a single external device, and software and/or firmware.

Figure 2:
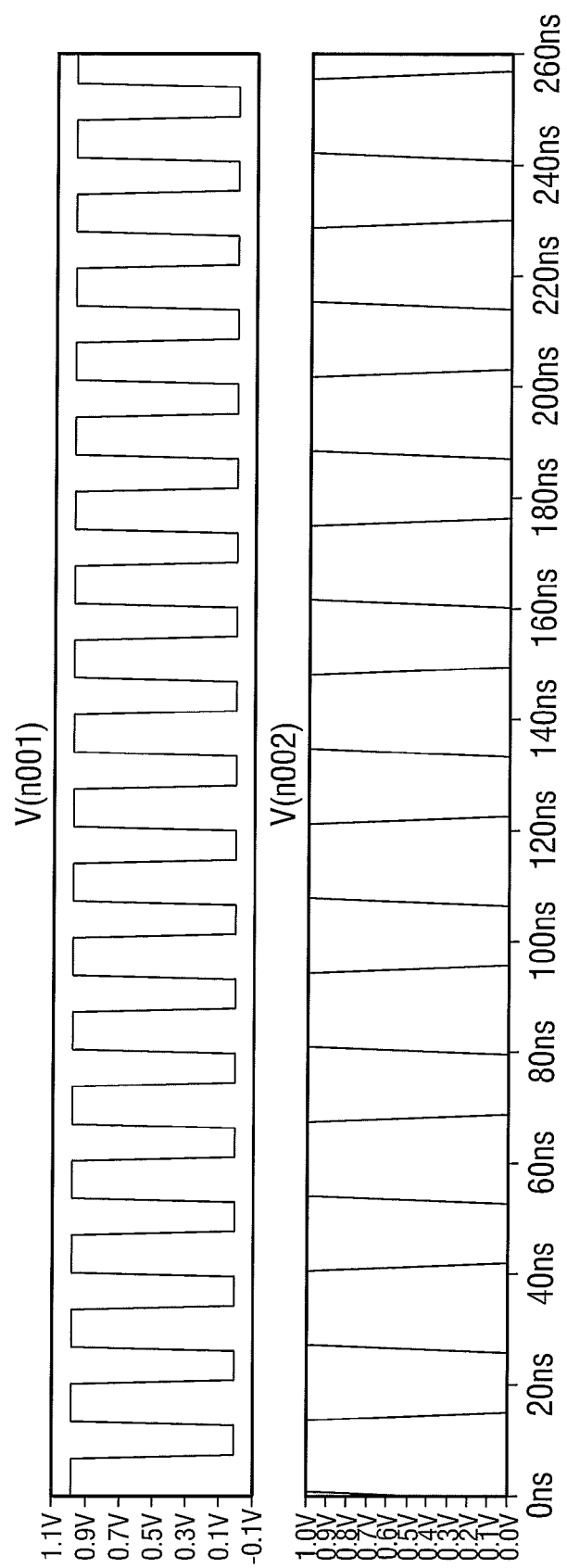
FIG. 2 illustrates a first example of an implementation of the operational frequency verification method in accordance with the present disclosure.
Figure 3:
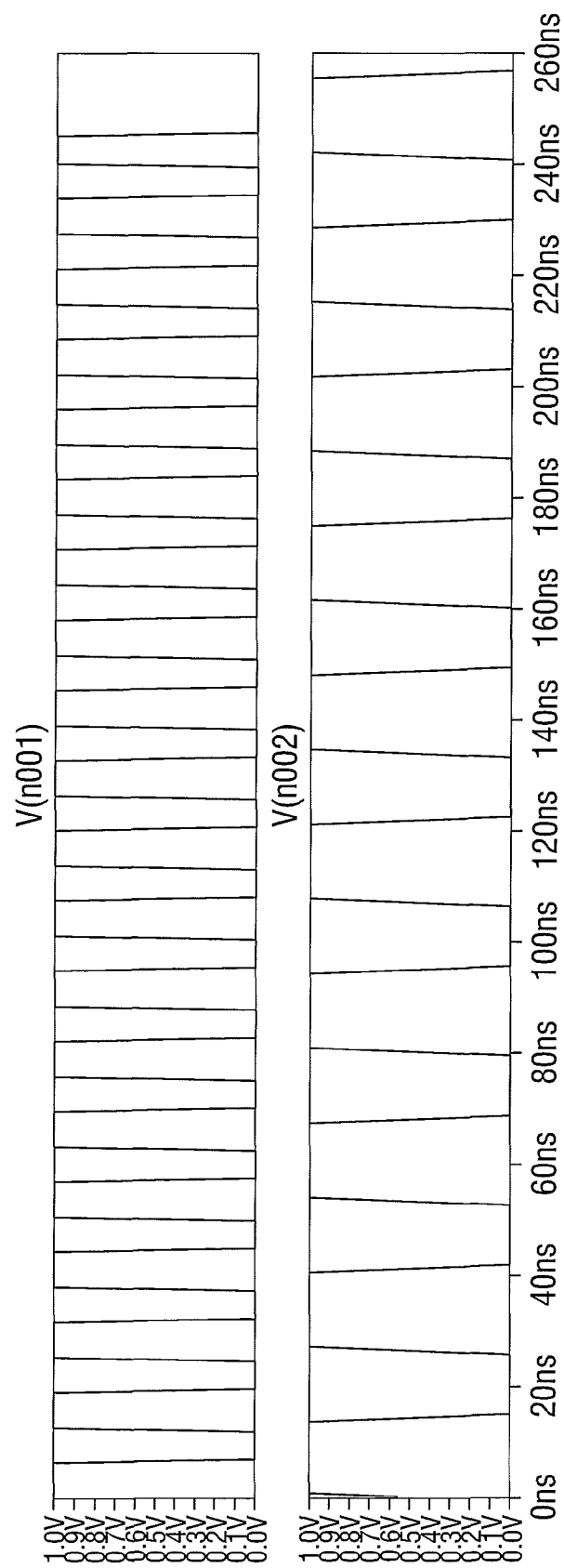
FIG. 3 illustrates a second example of an implementation of the operational frequency verification method in accordance with the present disclosure.

With more particularity with reference to FIGS. 1-3, the present disclosure relates to a system and method where digital control circuitry, designated by reference numeral 100 in FIG. 1, controlling a digitally controlled system, such as an electrosurgical system, is clocked using a control circuitry oscillator 200. The digital control circuitry 100 could include, but is not limited to, the following devices: microcontrollers, digital signal processors (DSPs), and field-programmable gate arrays (FPGAs). One or more of these devices can be used alone or in combination for performing the steps of verifying the operational frequency described herein in accordance with the present disclosure. Alternatively, at least one additional processor, microcontroller and/or FPGA is provided for performing the steps for verifying the operational frequency described herein in accordance with the present disclosure.

Upon power up, the external oscillator 300 starts and runs at the oscillator's fixed clock rate. The frequency of the external oscillator 300 is selected based on the needs of the specific application being performed by the digitally controlled system. The specific application could be, for example, an electrosurgical procedure. Certain criteria for selecting the frequency of the external oscillator 300 include, but are not limited to, a clock rate corresponding to a system controlled by the digital control circuitry 100, absolute tolerance of the frequency of the system being controlled, and a rate at which verification of the operational frequency needs to take place.

If only a coarse frequency check is required, then the clock rate of the external oscillator 300 may be much lower than the control clock frequency of the digital control circuitry 100 and the check may be short in duration. If a tighter tolerance is required, the clock rate of the external oscillator 300 will need to be closer to the control clock frequency of the digital control circuitry 100 or the duration of the check must increase.

In accordance with the present disclosure, once operational, the digital control circuitry 100 configures the external oscillator clock input such that the number of logic level transitions on the external oscillator clock input pin 110 can be easily counted. This may be an external interrupt input, a counter input, etc.

The control software and/or firmware of the digital control circuitry 100 then initiates a timed sequence where the number of transitions present on the external oscillator clock input pin 120 are counted over a fixed number of control clock cycles received on clock input pin 110. The two clock signals received at pins 110, 120 are each generated by a respective oscillator 200, 300. A transition is defined as either a rising or falling edge depending on the application.

Based on the expected control clock rate at clock input pin 110 and the known external oscillator clock rate at external oscillator clock input pin 120, the software can determine if the number of counts is within an acceptable range. The following equation can then be used to determine Digital Control Clock Frequency, which can then be compared to the acceptable operating range for verification purposes:

Digital Control Frequency=(Number of Control Clocks/Number of Transitions or Counts)*Frequency of External Oscillator Depending on the requirements of the system, the operational frequency check in accordance with the present disclosure may be run at start-up, periodically during use or each time before turning on the timing critical stage(s). In the event that power consumption of the device or system is critical, the external oscillator 300 may include an enable circuit to disconnect power to and disable switching when not in use.

FIG. 2 illustrates a first example of an implementation of the operational frequency verification method in accordance with the present disclosure. In this example, the digital control clock rate or frequency of the digital control circuitry 100 is 75 MHz, the frequency of the external oscillator 300 is 37.25 MHz, and the number of control clock cycles is 20 (bottom graph). The digital control circuitry 100 counts 10 transitions on the external oscillator clock input pin 120 (top graph). Based on the knowledge that the duration of sampling was 20 control clock cycles at the clock input pin 110 and the frequency of the external oscillator 300 is 37.25 MHz, the following mathematical operation confirms the digital control operational frequency:

Digital Control Frequency=(20/10)*37.25 MHz

Digital Control Frequency=75 MHz

FIG. 3 illustrates a second example of an implementation of the operational frequency verification method in accordance with the present disclosure. In this example, as in the first example, the digital control clock rate or frequency is 75 MHz, the external oscillator frequency is 37.25 MHz, and the number of control clock cycles is 20 (bottom graph). In this example, the oscillator of the digital control circuitry 100 is running fast and only counts 9 transitions on the external oscillator clock input pin 120 (top graph). Based on the knowledge that the duration of sampling was 20 control clock cycles at the clock input pin 110 and the external oscillator frequency is 37.25 MHz, the following mathematical operation confirms the digital control operational frequency is high and potentially outside the range of the specification:

Digital Control Frequency=(20/9)*37.25 MHz

Digital Control Frequency=82.8 MHz

Although embodiments have been described in detail with reference to the accompanying drawings for the purpose of illustration and description, it is to be understood that the inventive processes and apparatus are not to be construed as limited thereby. It will be apparent to those of ordinary skill in the art that various modifications to the foregoing embodiments may be made without departing from the scope of the disclosure.

What is claimed is:

1. An operational frequency verification system comprising:
    a first oscillator for generating a first clock signal;
    a second oscillator for generating a second clock signal; and
    digital control circuitry for receiving the first and second clock signals via first and second inputs, respectively;
    wherein an operational frequency of the digital control circuitry is verified by the second oscillator based on at least a timed sequence where a number of transitions on the second input are counted over a fixed number of control clock cycles at the first input.

2. The system according to claim 1, wherein the second oscillator is an external oscillator with respect to the digital control circuitry.

3. The system according to claim 1, wherein the digital control circuitry includes devices selected from the group consisting of microcontrollers, digital signal processors (DSPs), and field-programmable gate arrays (FPGAs).

4. The system according to claim 1, wherein, when the control circuitry is powered up, a frequency of the second oscillator is selected based on an electrosurgical procedure to be performed.

5. The system according to claim 4, wherein the frequency of the second oscillator is selected according to one or more of the following criteria: a clock rate corresponding to a system controlled by the digital control circuitry, an absolute tolerance of a frequency of the system being controlled, and a rate at which the verification of the operational frequency takes place.

6. The system according to claim 1, wherein the operational frequency of the digital control circuitry is further determined by dividing a number of clock cycles by a number of transitions and then multiplying the result with a predetermined frequency of the second oscillator.

7. The system according to claim 1, wherein the operational frequency verification takes place during a start-up phase.

8. The system according to claim 1, wherein the operational frequency verification takes place periodically during use.

9. The system according to claim 1, wherein the second oscillator includes an enable circuit for disconnecting the second oscillator from the digital control circuitry when power consumption is critical.

10. A method comprising:
    generating a first clock signal via a first oscillator;
    generating a second clock signal via a second oscillator;
    receiving the first and second clock signals via first and second inputs, respectively, of the digital control circuitry; and
    verifying an operational frequency of the digital control circuitry by the second oscillator based on at least a timed sequence where a number of transitions on the second input are counted over a fixed number of control clock cycles at the first input.

11. The method according to claim 10, wherein the second oscillator is an external oscillator with respect to the digital control circuitry.

12. The method according to claim 10, wherein the digital control circuitry includes devices selected from the group consisting of microcontrollers, digital signal processors (DSPs), and field-programmable gate arrays (FPGAs).

13. The method according to claim 10, further comprising selecting a frequency of the second oscillator based on an electrosurgical procedure to be performed.

14. The method according to claim 13, wherein the frequency of the second oscillator is selected according to one or more of the following criteria: a clock rate corresponding to a system controlled by the digital control circuitry, an absolute tolerance of a frequency of the system being controlled, and a rate at which the verification of the operational frequency takes place.

15. The method according to claim 10, further comprising determining the operational frequency of the digital control circuitry by dividing a number of clock cycles by a number of transitions and then multiplying the result with a predetermined frequency of the second oscillator.

16. The method according to claim 10, further comprising performing the operational frequency verification during a start-up phase.

17. The method according to claim 10, further comprising performing the operational frequency verification periodically during use.

18. The method according to claim 10, further comprising disconnecting the second oscillator from the digital control circuitry, via an enable circuit, when power consumption is critical.

19. A method of confirming an operational frequency in digital control circuitry, the method comprising:
    operating the digital control circuitry with a pair of oscillators; and
    manipulating one oscillator of the pair of oscillators to confirm the operational frequency based on a timed sequence where a number of transitions on a first input of the digital control circuitry are counted over a predetermined number of control clock cycles at a second input of the digital control circuitry.

20. The method according to claim 19, further comprising selecting a fixed frequency of the oscillator of the pair of oscillators that confirms the operational frequency of the digital control circuitry based on an electrosurgical procedure to be performed.

* * * * *